US011073656B2

(12) United States Patent
Takasaka et al.

(10) Patent No.: US 11,073,656 B2
(45) Date of Patent: Jul. 27, 2021

(54) OPTICAL COUPLER AND OPTICAL AMPLIFIER

(71) Applicant: FURUKAWA ELECTRIC CO., LTD., Tokyo (JP)

(72) Inventors: Shigehiro Takasaka, Tokyo (JP); Koichi Maeda, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/893,589

(22) Filed: Jun. 5, 2020

(65) Prior Publication Data

US 2020/0301066 A1    Sep. 24, 2020

Related U.S. Application Data

(63) Continuation of application No. PCT/JP2018/046393, filed on Dec. 17, 2018.

(30) Foreign Application Priority Data

Dec. 15, 2017   (JP) .............................. JP2017-241049

(51) Int. Cl.
  *G02B 6/028*   (2006.01)
  *G02B 6/02*    (2006.01)
  (Continued)

(52) U.S. Cl.
  CPC ....... *G02B 6/0286* (2013.01); *G02B 6/02042* (2013.01); *G02B 6/0288* (2013.01);
  (Continued)

(58) Field of Classification Search
  CPC .............. G02B 6/0286; G02B 6/02042; G02B 6/0288; G02B 6/4296; G02B 6/255; G02B 6/26; H01S 5/5009; H01S 3/067
  See application file for complete search history.

(56) References Cited

U.S. PATENT DOCUMENTS

| 4,962,986 A | 10/1990 | Hompel et al. |
| 5,136,420 A | 8/1992 | Inagaki et al. |

(Continued)

FOREIGN PATENT DOCUMENTS

| JP | 03-025985 A | 2/1991 |
| JP | 2002-237637 A | 8/2002 |

(Continued)

OTHER PUBLICATIONS

International Search Report dated Mar. 12, 2019 in PCT/JP2018/046393 filed on Dec. 17, 2018 (with English Translation), citing documents AA-AD & AO-AU therein, 5 pages.

(Continued)

*Primary Examiner* — John Bedtelyon
(74) *Attorney, Agent, or Firm* — Oblon, McClelland, Maier & Neustadt, L.L.P.

(57) ABSTRACT

An aim is to provide an optical coupler that contributes increasing pump-efficiency in an optical amplifier, and the optical amplifier. The optical amplifier includes: a main optical fiber that includes a core transmitting signal light, an inner cladding portion formed around an outer periphery of the core and having a refractive index lower than a refractive index of the core, and an outer cladding portion formed around an outer periphery of the inner cladding portion and having a refractive index lower than the refractive index of the inner cladding portion, a part of the outer cladding portion of which in a longitudinal direction being removed; and at least one pump-light input-output optical fiber that is fusion-spliced to the inner cladding portion of the main optical fiber at the portion where the outer cladding portion (Continued)

is removed, an average refractive index of which in a contact region where the pump-light input-output optical fiber is in contact with the inner cladding portion being larger than the refractive index of the inner cladding portion. Pump-light propagating in the pump-light input-output optical fiber is coupled to the inner cladding portion from the contact region and propagates in the inner cladding portion, or the pump-light propagating in the inner cladding portion is coupled to the pump-light input-output optical fiber from the contact region and propagates in the pump-light input-output optical fiber.

11 Claims, 17 Drawing Sheets

(51) Int. Cl.
G02B 6/42 (2006.01)
G02B 6/255 (2006.01)
H01S 5/50 (2006.01)

(52) U.S. Cl.
CPC ............ *G02B 6/4296* (2013.01); *G02B 6/255* (2013.01); *H01S 5/5009* (2013.01)

(56) References Cited

U.S. PATENT DOCUMENTS

| 9,871,338 | B2 * | 1/2018 | Price ................. H01S 3/1603 |
| 2004/0047553 | A1 | 3/2004 | Even et al. |
| 2006/0002434 | A1 | 1/2006 | Nakano et al. |

FOREIGN PATENT DOCUMENTS

| JP | 2006-019490 A | 1/2006 |
| JP | 2009-129940 A | 6/2009 |
| JP | 2010-239035 A | 10/2010 |
| JP | 2012-209430 A | 10/2012 |
| WO | WO 02/27369 A1 | 4/2002 |

OTHER PUBLICATIONS

Abedin et al., "Multicore Erbium Doped Fiber Amplifiers for Space Division Multiplexing Systems", Journal of Lightwave Technology, vol. 32, No. 16, Aug. 15, 2014, pp. 2800-2808.

Abedin et al., "Cladding-pumped erbium-doped multicore fiber amplifier", Optics Express, vol. 20, No. 18, Aug. 27, 2012, pp. 20191-20200.

* cited by examiner

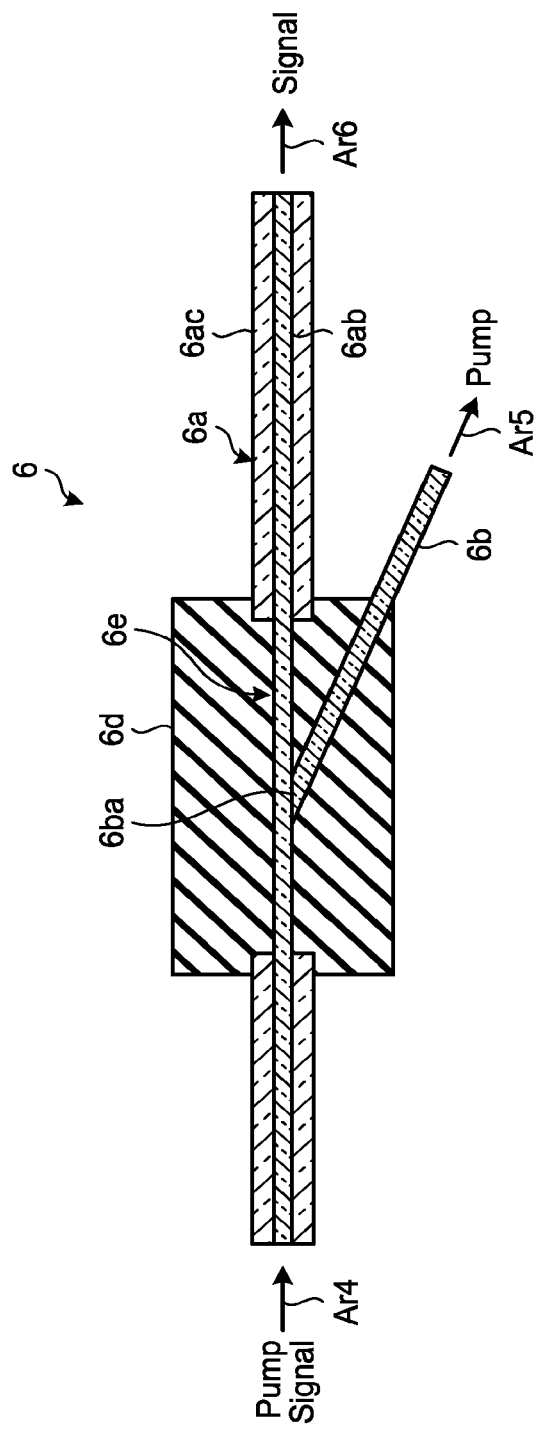

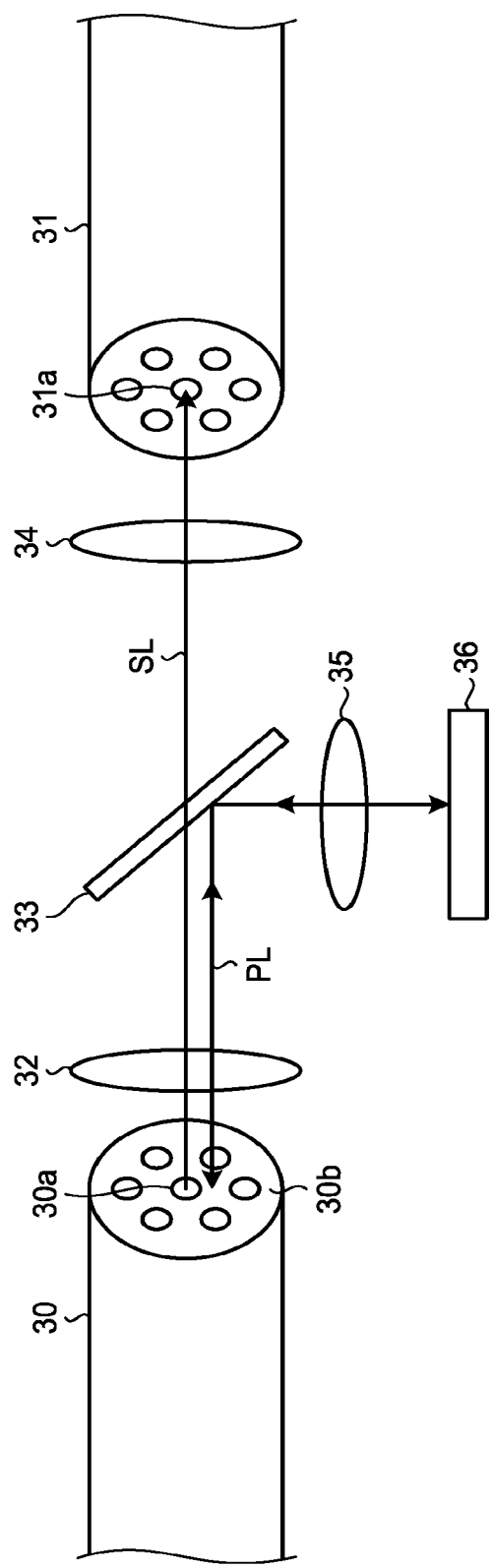

OPTICAL COUPLER AND OPTICAL AMPLIFIER

CROSS-REFERENCE TO RELATED APPLICATION(S)

This application is a continuation of International Application No. PCT/JP2018/046393, filed on Dec. 17, 2018, which is based on Japanese Patent Application No. 2017-241049, fined in Japan on Dec. 15, 2017, the entire contents of which are incorporated herein by reference.

BACKGROUND

The present disclosure relates to an optical coupler and an optical amplifier.

BACKGROUND

For example, in uses such as submarine optical communication, it is expected to reduce power consumption of optical amplifiers using multi-core erbium-doped optical fiber amplifiers (EDFAs) as the optical amplifiers.

Configurations of the multi-core EDFAs are known that use a double cladding multi-core EDF and optically pump, by cladding pumping, erbium (Er) that serves as an optical amplifying medium and is doped in the cores (refer to Kazi S Abedin et al., "Multimode Erbium Doped Fiber Amplifiers for Space Division Multiplexing Systems", Journal of Lightwave Technology, Vol. 32, No. 16, Aug. 15, 2014 pp. 2800-2808; and Kazi S Abedin et al., "Cladding-pumped erbium-doped multicore fiber amplifier", Optics Express Vol. 20, No. 18 27 Aug. 2012 pp. 20191-20200.

SUMMARY

There is a need for providing an optical coupler that contributes an increase in pump-efficiency in an optical amplifier and the optical amplifier using the optical coupler.

According to an embodiment, an optical coupler includes: a main optical fiber that includes at least one core, which transmits signal light, an inner cladding portion, formed around an outer periphery of the core, having a refractive index lower than a refractive index of the core, and an outer cladding portion, formed around an outer periphery of the inner cladding portion, having a refractive index lower than the refractive index of the inner cladding portion, a part of the outer cladding portion of which in a longitudinal direction being removed; and at least one pump-light input-output optical fiber that is fusion-spliced to the inner cladding portion of the main optical fiber at a portion where the outer cladding portion is removed, an average refractive index of which in a contact region where the pump-light input-output optical fiber is in contact with the inner cladding portion being larger than the refractive index of the inner cladding portion. Further, pump-light propagating in the pump-light input-output optical fiber is coupled to the inner cladding portion from the contact region and propagates in the inner cladding portion, or the pump-light propagating in the inner cladding portion is coupled to the pump-light input-output optical fiber from the contact region and propagates in the pump-light input-output optical fiber.

BRIEF DESCRIPTION OF DRAWINGS

FIG. 4A is a schematic diagram illustrating a configuration of a second optical coupler;
FIG. 17 is a diagram explaining example 2 of the recycling mechanism of pump-light using reflection of light.

DETAILED DESCRIPTION

In the related art, the optical amplifiers are required to increase pump-efficiency from the viewpoint of power consumption reduction, for example. The pump-efficiency is represented by a ratio of power of optically amplified signal light to power of pump-light. The higher the pump-efficiency, the larger the signal light power even when the pump-light power is constant. Part of power that fails to contribute optical amplification of the signal light in the pump-light power is converted into heat and discharged, for example. Particularly, the EDF has a lower pump-efficiency than those of a YDF including ytterbium (Yb) as another optical amplifying medium and an EYDF including erbium and ytterbium, and is, thus, required to have higher pump-efficiency.

The following describes embodiments with reference to the accompanying drawings. The present disclosure is not limited by the embodiments. Elements identical or corresponding to each other are provided with the same numeral appropriately in the respective drawings. The drawings are schematic and attention needs to be paid that dimensional relations among the elements and ratios among the elements differ from those of actual ones in some cases, for example. Among the drawings, the dimensional relations and ratios among the elements also differ in some cases.

First Embodiment

Figure 1:
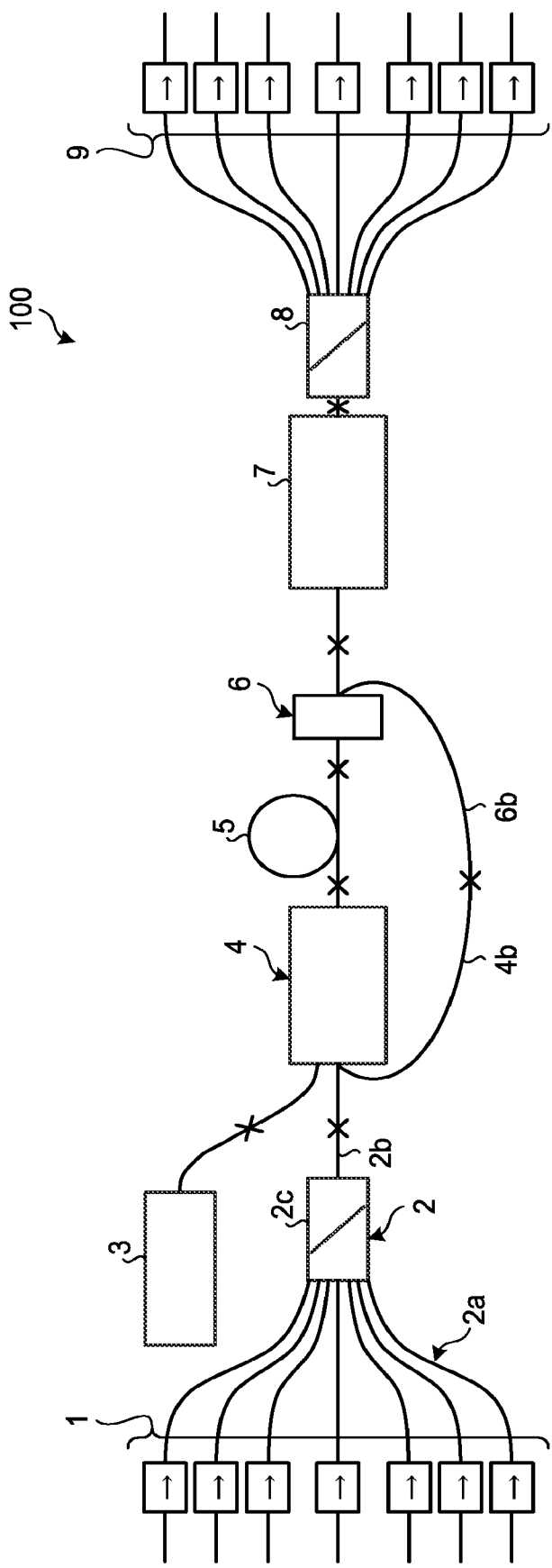
FIG. 1 is a schematic diagram illustrating a configuration of an optical amplifier according to a first embodiment.

FIG. 1 is a schematic diagram illustrating a configuration of an optical amplifier according to a first embodiment. As illustrated in FIG. 1, an optical amplifier 100 includes seven optical isolators 1, an optical fiber fan in (FAN IN) 2, a semiconductor laser 3, a first optical coupler 4, a multi-core EDF 5, a second optical coupler 6, a pump stripper 7, an optical fiber fan out (FAN OUT) 8, and seven optical isolators 9. In FIG. 1, a symbol "X" indicates a fusion splice point of optical fibers.

The optical fiber fan in 2 includes bundled seven single mode optical fibers 2a and a multi-core fiber 2b having seven cores. The optical fiber fan in 2 is configured to cause the respective cores of the seven single mode optical fibers 2a to be optically coupled to the corresponding cores of the multi-core fiber 2b in a coupling portion 2c. The seven single mode optical fibers 2a are standard single mode optical fibers defined in the International Telecommunication Union Telecommunication Standardization Sector (ITU-T) G.652, for example. Each single mode optical fiber 2a is provided with the optical isolator 1. The optical isolators 1 and 9 each allow light to pass in the direction indicated by the arrow and block the pass of light in the opposite direction. The multi-core fiber 2b is connected to the first optical coupler 4. An end surface for optical coupling of each of the bundled seven single mode optical fibers 2a and the multi-core fiber 2b is processed obliquely with respect to an optical axis for reflection prevention. The end surface may be orthogonal to the optical axis.

Figure 2:
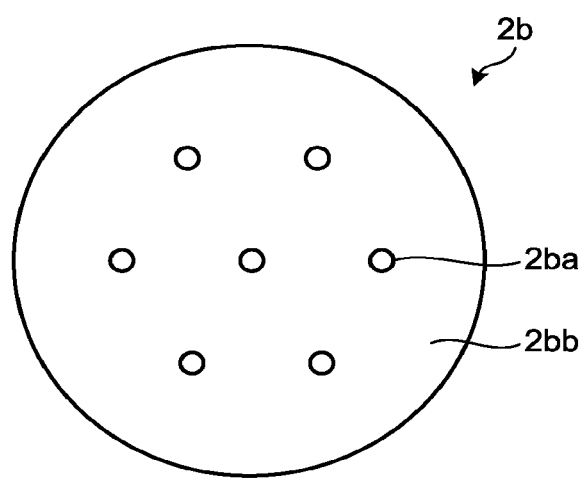
FIG. 2 is a schematic diagram illustrating a configuration of a multi-core fiber.

As illustrated in FIG. 2, the multi-core fiber 2b of the optical fiber fan in 2 includes seven cores 2ba arranged in a triangular lattice shape and a cladding portion 2bb that is formed around the outer peripheries of the cores 2ba and has a lower refractive index than that of each core 2ba. The outer diameter of the cladding portion 2bb is 135 µm, for example. The distance between the cores 2ba most adjacent each other is 38.5 µm, for example. When signal light components are input in respective single mode optical fibers 2a of the optical fiber fan in 2, each optical isolator 1 allows its corresponding signal light component to pass therethrough and each core 2ba of the multi-core fiber 2b transmits its corresponding signal light component.

The semiconductor laser 3, which is a pump-light source and a lateral multi-mode semiconductor laser, outputs pump-light. The wavelength of the pump-light is 975 nm, which is nearly the same as the wavelength of an absorption peak of erbium ion in the 900 nm wavelength band. The semiconductor laser 3 outputs pump-light from a multi-mode optical fiber. The multi-mode optical fiber is a step-index type. The multi-mode optical fiber has a core diameter of 105 µm, a cladding diameter of 125 µm, and an NA of 0.16 or 0.22, for example.

Figure 3A:
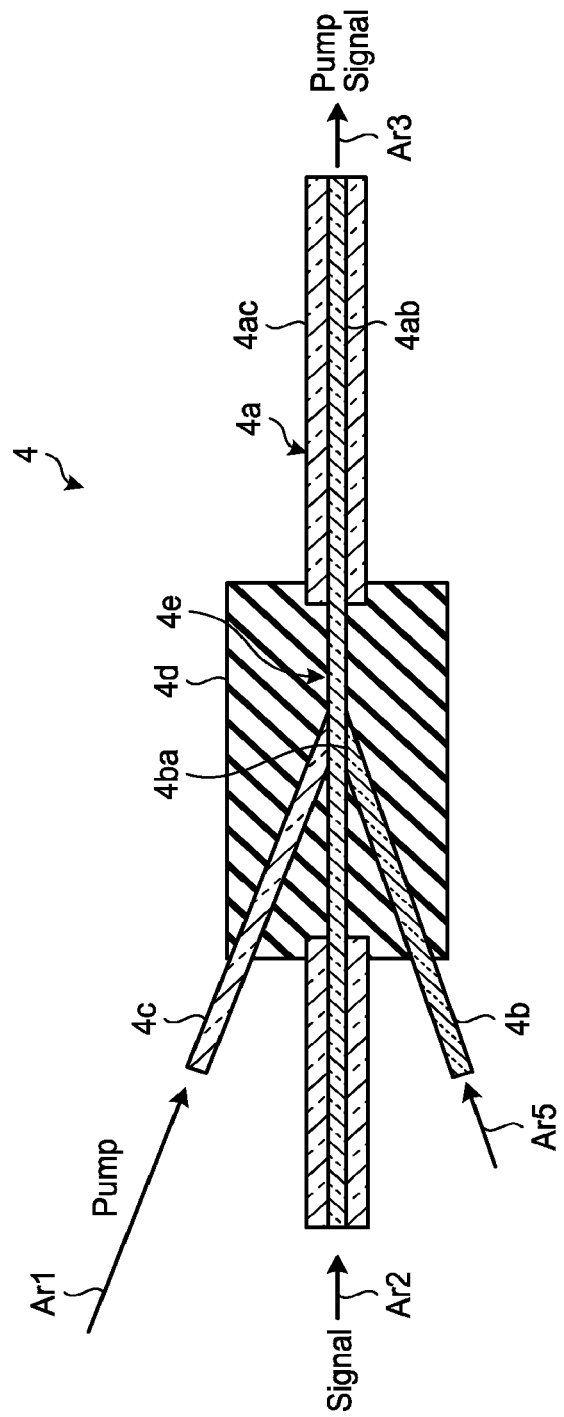
FIG. 3A is a schematic diagram illustrating a configuration of a first optical coupler.
Figure 3B:
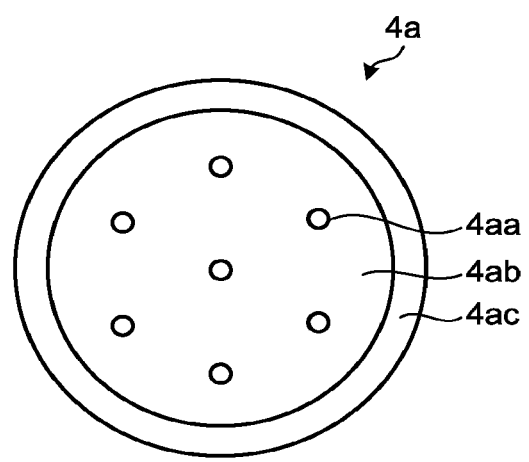
FIG. 3B is a schematic diagram illustrating the configuration of the first optical coupler.

As illustrated in FIG. 3A, the first optical coupler 4 includes a main optical fiber 4a, a pump-light input-output optical fiber 4b, a pump-light supply optical fiber 4c, and a protector 4d. As illustrated in FIG. 3B, the main optical fiber 4a, which is a double cladding optical fiber, includes seven cores 4aa that are arranged in a triangular lattice shape in the same manner as the cores 2ba of the multi-core fiber 2b, an inner cladding portion 4ab that is formed around the outer peripheries of the cores 4aa and has a lower refractive index than that of each core 4aa, and an outer cladding portion 4ac that is formed on the outer periphery of the inner cladding portion 4ab and has a lower refractive index than that of the inner cladding portion 4ab. The cores 4aa and the inner cladding portion 4ab are made of silica glass while the outer cladding portion 4ac is made of a resin.

As illustrated in FIG. 3A, a part of the outer cladding portion 4ac is removed in the longitudinal direction. In a portion 4e where the outer cladding portion 4ac is removed, one end of the pump-light input-output optical fiber 4b and one end of the pump-light supply optical fiber 4c are fusion-spliced to the inner cladding portion 4ab. The protector 4d is provided for protecting the inner cladding portion 4ab in the portion 4e where the outer cladding portion 4ac is removed.

The other end of the pump-light supply optical fiber 4c is connected to the multi-mode optical fiber of the semiconductor laser 3. The pump-light supply optical fiber 4c is the same type as the multi-mode optical fiber of the semiconductor laser 3. The pump-light supply optical fiber 4c, which is a step-index type, has a core diameter of 105 µm, a cladding diameter of 125 µm, and an NA of 0.16 or 0.22, for example. The pump-light (pump) indicated with arrow Ar1 is input to the pump-light supply optical fiber 4c from the semiconductor laser 3. The pump-light supply optical fiber 4c supplies the pump-light to the main optical fiber 4a. The inner cladding portion 4ab transmits pump-light.

Pump-light is coupled to the inner cladding portion 4ab from the pump-light input-output optical fiber 4b, and propagates in the inner cladding portion 4ab, which is described later in detail.

One end of the main optical fiber 4a is connected to the multi-core fiber 2b of the optical fiber fan in 2. The respective cores 2ba of the multi-core fiber 2b are connected to the corresponding cores 4aa of the main optical fiber 4a. Each signal light component (signal) propagating in its corresponding core 2ba of the multi-core fiber 2b enters the main optical fiber 4a as illustrated with arrow Art to be optically coupled to its corresponding core 4aa. Each core 4aa transmits its corresponding signal light component. The pump-light and each signal light component are output from the main optical fiber 4a to the multi-core EDF 5 as illustrated with arrow Ar3.

The multi-core EDF 5, which is a seven-core type, includes seven optical amplifying cores that are arranged in a triangular lattice shape in the same manner as the main optical fiber 4a of the first optical coupler 4, an inner cladding portion that is formed around the outer peripheries of the optical amplifying cores and has a lower refractive index than that of each optical amplifying core, and an outer cladding portion that is formed on the outer periphery of the inner cladding portion and has a lower refractive index than that of the inner cladding portion. The multi-core EDF 5 is a known cladding pumped optical amplifying fiber. The optical amplifying cores of the multi-core EDF 5 include erbium ion serving as an optical amplifying medium.

One end of the multi-core EDF 5 is connected to the main optical fiber 4a of the first optical coupler 4. The respective cores of the multi-core EDF 5 are connected to the corresponding cores 4aa of the main optical fiber 4a. The inner cladding portion of the multi-core EDF 5 is connected to the inner cladding portion 4ab of the main optical fiber 4a. Each signal light component and the pump-light that propagate in the main optical fiber 4a enter the multi-core EDF 5. In the multi-core EDF 5, each signal light component propagates in its corresponding optical amplifying core and the pump-light propagates in the inner cladding portion in the same direction. The pump-light optically pumps erbium in the respective optical amplifying cores while propagating in the inner cladding portion. Each signal light component propagating in its corresponding optical amplifying core is optically amplified by an action of stimulated emission from erbium. The multi-core EDF 5 outputs each optically amplified signal light component and the pump-light that fails to contribute the optical amplification.

Figure 4B:
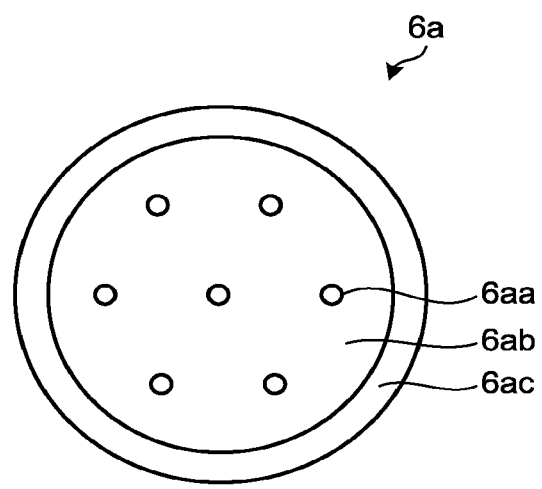
FIG. 4B is a schematic diagram illustrating the configuration of the second optical coupler.

As illustrated in FIG. 4A, the second optical coupler 6 includes a main optical fiber 6a, a pump-light input-output optical fiber 6b, and a protector 6d. As illustrated in FIG. 4B, the main optical fiber 6a, which is a double cladding optical fiber, includes seven cores 6aa that are arranged in a triangular lattice shape in the same manner as the cores 4aa of the main optical fiber 4a, an inner cladding portion 6ab that is formed around the outer peripheries of the cores 6aa and has a lower refractive index than that of each core 6aa, and an outer cladding portion 6ac that is formed on the outer periphery of the inner cladding portion 6ab and has a lower refractive index than that of the inner cladding portion 6ab. The cores 6aa and the inner cladding portion 6ab are made of silica glass while the outer cladding portion 6ac is made of a resin.

As illustrated in FIG. 4A, a part of the outer cladding portion 6ac is removed in the longitudinal direction. In a portion 6e where the outer cladding portion 6ac is removed, the pump-light input-output optical fiber 6b is fusion-spliced to the inner cladding portion 6ab. The protector 6d is provided for protecting the inner cladding portion 6ab in the portion 6e where the outer cladding portion 6ac is removed.

One end of the main optical fiber 6a is connected to the multi-core EDF 5. The respective cores of the multi-core EDF 5 are connected to the corresponding cores 6aa of the main optical fiber 6a. The inner cladding portion of the multi-core EDF 5 is connected to the inner cladding portion 6ab of the main optical fiber 6a. Each optically amplified signal light component and the pump-light failing to contribute the optical amplification that are output from the multi-core EDF 5 enter the main optical fiber 6a as illustrated with arrow Ar4. Each optically amplified signal light component propagates in its corresponding core 6aa and the pump-light failing to contribute the optical amplification propagates in the inner cladding portion 6ab.

In the second optical coupler 6, the pump-light input-output optical fiber 6b is fusion-spliced to and in contact with the inner cladding portion 6ab of the main optical fiber 6a in a contact region 6ba. An average refractive index in the contact region 6ba is larger than the refractive index of the inner cladding portion 6ab. As a result, at least part of pump-light propagating in the inner cladding portion 6ab is coupled to the pump-light input-output optical fiber 6b from the contact region 6ba and propagates in the pump-light input-output optical fiber 6b. The coupling is what is called a lateral coupling type, in which pump-light is coupled to the pump-light input-output optical fiber 6b from a side surface of the inner cladding portion 6ab. The pump-light input-output optical fiber 6b is disposed such that the pump-light input-output optical fiber 6b makes an acute angle with respect to the direction of propagation of the pump-light in the main optical fiber 6a, thereby making it easy to be coupled to the pump-light.

The average refractive index is defined by the following formula, for example.

$$\frac{\int_0^{r_0} n(r) \cdot 2\pi r \, dr}{\pi r_0^2}$$

where n(r) is a function that indicates the dependency of the radius (r) on a relative refractive-index difference with respect to pure silica glass in the pump-light input-output optical fiber 6b, for example, and $r_0$ is the outer diameter of a region in which light propagates.

As illustrated in FIG. 1, the pump-light input-output optical fiber 6b of the second optical coupler 6 and the pump-light input-output optical fiber 4b of the first optical coupler 4 are connected. The pump-light that is output from the pump-light input-output optical fiber 6b after propagating therein as illustrated with arrow Ar5 in FIG. 4A enters the pump-light input-output optical fiber 4b as illustrated with the arrow Ar5 illustrated in FIG. 3A and propagates therein.

Further, the average refractive index in a contact region 4ba where the pump-light input-output optical fiber 4b is fusion-spliced to and in contact with the inner cladding portion 4ab of the main optical fiber 4a is larger than the refractive index of the inner cladding portion 4ab. As a result, the pump-light is coupled to the inner cladding portion 4ab from the pump-light input-output optical fiber 4b, and propagates in the inner cladding portion 4ab together with the pump-light supplied from the pump-light supply optical fiber 4c. The coupling in this case is also a lateral coupling type in which the pump-light is coupled to the side surface of the inner cladding portion 4ab from the pump-light input-output optical fiber 4b. The pump-light input-output optical fiber 4b is also disposed such that the pump-light input-output optical fiber 4b makes an acute angle with respect to the direction of propagation of the pump-light in the main optical fiber 4a, thereby making it easy for the pump-light to be coupled to the inner cladding portion 4ab.

Each signal light component propagating in its corresponding core 6aa of the main optical fiber 6a is output to the pump stripper 7 from the main optical fiber 6a as illustrated with arrow Ar6. The pump-light that fails to be coupled to the pump-light input-output optical fiber 6b is also output to the pump stripper 7 from the main optical fiber 6a.

The pump stripper 7, which is a known device, removes pump-light output from the main optical fiber 6a of the second optical coupler 6. The pump stripper 7 is a double cladding multi-core fiber having seven cores and a part of the outer cladding portion thereof is removed, for example. The pump stripper 7 has a configuration in which pump-light is emitted from a surface of the inner cladding portion in the part where the outer cladding portion is removed to a heat radiation plate, for example, as irradiation light to be absorbed, thereby allowing energy of the pump-light to be radiated as heat by being converted into thermal energy. The pump stripper 7 transmits each signal light component in the multi-core fiber and reduces the power of pump-light to such a level that the pump-light causes no problem when being output from the optical amplifier 100.

The optical fiber fan out 8 includes bundled seven single mode optical fibers and a multi-core fiber having seven cores in the same manner as the optical fiber fan in 2. The optical fiber fan out 8 is configured to cause the respective cores of the seven single mode optical fibers to be optically coupled to the corresponding cores of the multi-core fiber in a coupling portion. Each single mode optical fiber is provided with the optical isolator 9. The multi-core fiber is connected to the pump stripper 7. An end surface for optical coupling of each of the bundled seven single mode optical fibers and the multi-core fiber is processed obliquely with respect to an optical axis for reflection prevention. The end surface may be orthogonal to the optical axis.

The signal light components are input in the respective cores of the optical fiber fan out 8 from the corresponding cores of the multi-core fiber of the pump stripper V. In the optical fiber fan out 8, each signal light component propagates in its corresponding core in the single mode optical fiber, passes through its corresponding optical isolator 9, and is output.

In the optical amplifier 100, in the pump-light that is output from the semiconductor laser 3 and supplied to the multi-core EDF 5 via the first optical coupler 4, at least part of the pump-light failing to contribute the optical pumping in the multi-core EDF 5 is collected by the second optical coupler 6. The collected pump-light travels through the pump-light input-output optical fiber 6b and the pump-light input-output optical fiber 4b, and enters the first optical coupler 4 to be recycled as pump-light and supplied to the multi-core EDF 5 again. This makes it possible to increase pump-efficiency in the optical amplifier 100.

The following exemplifies preferable characteristics of the pump-light input-output optical fibers 4b and 6b. As described above, the average refractive index of the pump-light input-output optical fiber 4b in the contact region 4ba where the pump-light input-output optical fiber 4b is in contact with the inner cladding portion 4ab of the main optical fiber 4a is larger than the refractive index of the inner cladding portion 4ab, and the average refractive index of the pump-light input-output optical fiber 6b in the contact region 6ba where the pump-light input-output optical fiber 6b is in contact with the inner cladding portion 6ab of the main optical fiber 6a is larger than the refractive index of the inner cladding portion 6ab. Such conditions can be achieved as follows: the inner cladding portions 4ab and 6ab are formed of pure silica glass, and for the pump-light input-output optical fibers 4b and 6b, an optical fiber is used that has the same refractive index profile as the core of a commercial graded index (GI) fiber and has no cladding in the commercial GI fiber (hereinafter described as a no-cladding GI fiber), for example. The pump-light input-output optical fibers 4b and 6b can be also achieved by an optical fiber that has only the core made of silica glass of a commercial step index (SI) fiber and is covered with a resin having a low refractive index.

Figure 5:
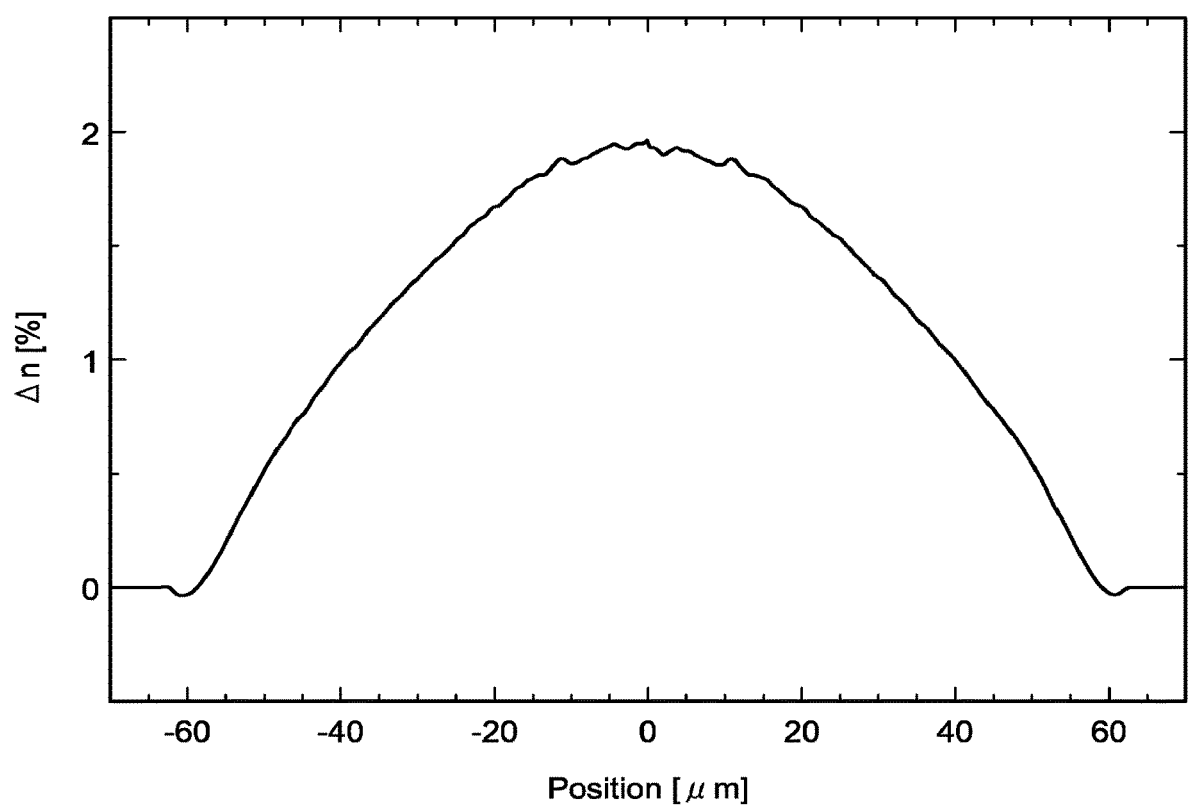
FIG. 5 is a diagram illustrating a typical refractive index profile of a pump-light input-output optical fiber.

FIG. 5 is a diagram illustrating a typical refractive index profile of the pump-light input-output optical fiber. The abscissa axis represents the position from the center axis of the optical fiber in the radius direction while the vertical axis represents the relative refractive-index difference (Δn) with respect to pure silica glass. The pump-light input-output optical fiber is the no-cladding GI fiber and has a diameter of approximately 120 μm. The maximum value of the relative refractive-index difference near the center axis is approximately 2% while the relative refractive-index difference at positions of ±60 μm (i.e., the outer circumference of the optical fiber) is nearly zero, which is nearly the same as the refractive index of pure silica glass. When such a no-cladding GI fiber is used for the pump-light input-output optical fibers 4b and 6b and the inner cladding portion 4ab is made of pure silica glass, the relative refractive-index difference of the average refractive index of the pump-light input-output optical fiber 4b in the contact region 4ba with respect to the refractive index of the inner cladding portion 4ab is approximately 0.83%.

It is preferable that the relative refractive-index difference of the average refractive index of the pump-light input-output optical fiber 4b in the contact region 4ba with respect to the refractive index of the inner cladding portion 4ab be equal to or larger than 0.05% from the viewpoint of effective collection of the pump-light. Likewise, it is preferable that the relative refractive-index difference of the average refractive index of the pump-light input-output optical fiber 6b in the contact region 6ba with respect to the refractive index of the inner cladding portion 6ab be equal to or larger than 0.05% from the viewpoint of effective collection of the pump-light.

From the viewpoint of efficient recycling of the collected pump-light, it is more preferable that the pump-light input-output optical fibers 4b and 6b be the same optical fiber because connection loss at the connection point of the pump-light input-output optical fibers 4b and 6b can be reduced. From the viewpoint of efficient recycling of the collected pump-light, it is more preferable that a difference between the refractive index profile of the pump-light input-output optical fiber 4b and the refractive index profile of the pump-light input-output optical fiber 6b be a range of ±0.2% in relative refractive-index difference.

It is preferable that a numerical aperture of the pump-light input-output optical fiber 6b be equal to or smaller than that of the pump-light input-output optical fiber 4b when the refractive index profile of the pump-light input-output optical fiber 4b and the pump-light input-output optical fiber 6b are not the same optical fiber, because the connection loss at the connection point of the pump-light input-output optical fibers 4b and 6b can be reduced.

Modification

Figure 6:
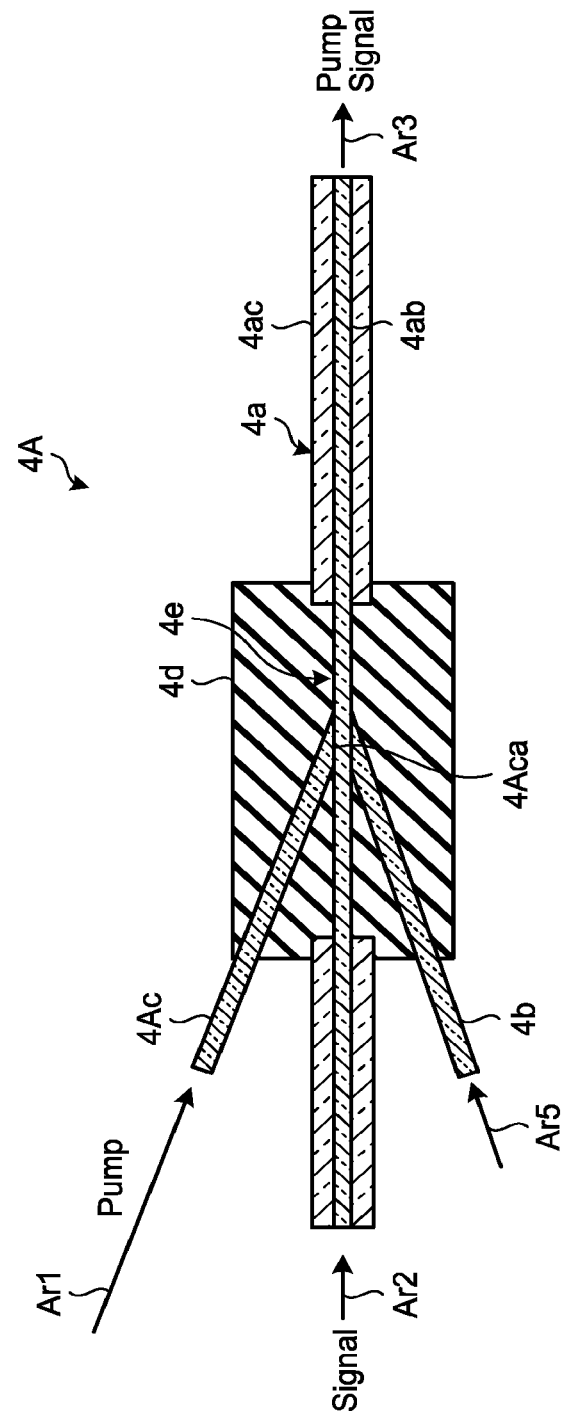
FIG. 6 is a schematic diagram illustrating a modification of the first optical coupler.

FIG. 6 is a schematic diagram illustrating a configuration of a modification of the first optical coupler. A first optical coupler 4A in the modification has a configuration in which the pump-light supply optical fiber 4c in the first optical coupler 4 illustrated in FIGS. 3A and 3B is replaced with a pump-light supply optical fiber 4Ac. The pump-light supply optical fiber 4Ac is the same optical fiber as the pump-light input-output optical fiber 4b. As a result, the average refractive index of the pump-light supply optical fiber 4Ac in a contact region 4Aca where the pump-light supply optical fiber 4Ac is fusion-spliced to and in contact with the inner cladding portion 4ab of the main optical fiber 4a is also larger than the refractive index of the inner cladding portion 4ab. This makes it possible to increase coupling efficiency of the pump-light input from the semiconductor laser 3 as illustrated with the arrow Ar1 with respect to the inner cladding portion 4ab, resulting in the pump-efficiency being increased.

Experimental Examples 1 to 5

Figure 7:
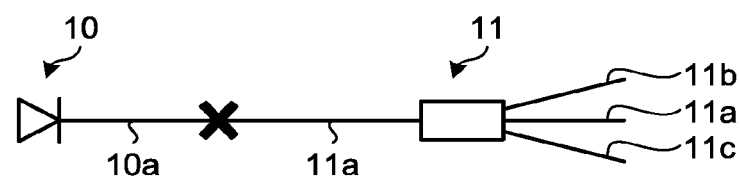
FIG. 7 is a diagram explaining experimental example 1.

The following describes examples of experiments done for checking effects of increasing in pump-efficiency in the present disclosure. FIG. 7 is a diagram explaining experimental example 1. In the experimental example 1, a multi-mode optical fiber 10a, which is a step-index type and has a core diameter of 105 μm and a cladding diameter of 125 μm, was attached to a semiconductor laser 10, which outputs laser light having a wavelength of 975 nm as pump-light, and the multi-mode optical fiber 10a was connected to an optical coupler 11. In the multi-mode optical fiber 10a, the core is made of pure silica glass while the cladding portion is made of silica glass doped with fluorine. The relative refractive-index difference of the multi-mode optical fiber 10a with respect to pure silica glass is approximately −1.25%. The average refractive index of the multi-mode optical fiber 10a is approximately −0.36%. The optical coupler 11 includes a multi-core fiber 11a having the same configuration as the main optical fiber 6a of the second optical coupler 6, a multi-mode optical fiber 11b that is the same as the multi-mode optical fiber 10a, and a no-cladding GI fiber 11c having the refractive index profile illustrated in FIG. 5. The multi-mode optical fiber 10a and the multi-core fiber 11a were fusion-spliced at the position indicated by symbol "X". The multi-mode optical fiber 10a and the multi-core fiber 11a were connected such that pump-light output from the multi-mode optical fiber 10a is coupled to the inner cladding portion of the multi-core fiber 11a. The multi-mode optical fiber 11b and the no-cladding GI fiber 11c were connected to the inner cladding portion of the multi-core fiber 11a at the portion where the outer cladding portion of the inner cladding portion of the multi-core fiber 11a is removed in the same manner as the pump-light input-output optical fiber 6b in the second optical coupler 6.

Samples 1-1 and 1-2 having the configuration illustrated in FIG. 7 were made. Pump-light was output from the semiconductor laser 10 and each power of the pump-light output from the multi-mode optical fiber 11b, the multi-core fiber 11a, and the no-cladding GI fiber 11c was measured. A ratio of the measured power to the output power from the semiconductor laser 10 was calculated for each sample. The sample 1-1 had the following results:

the ratio in relation to the multi-mode optical fiber 11b was 4.8%, the ratio in relation to the no-cladding GI fiber 11c was 25.8°, and the ratio in relation to the multi-core fiber 11a was 68.3%. The sample 1-2 had the following results:

the ratio in relation to the multi-mode optical fiber 11b was 4.0%, the ratio in relation to the no-cladding GI fiber 11c was 28.0%, and the ratio in relation to the multi-core fiber 11a was 66.1%. In the above results, it was found that the no-cladding GI fiber 11c has a higher ratio than that of the multi-mode optical fiber 11b and, thus, the no-cladding GI fiber 11c is effective for collection of pump-light.

Samples 1'-1 and 1'-2 were made that have a configuration obtained by replacing the multi-mode optical fiber 11b with the no-cladding GI fiber 11c in the configuration illustrated in FIG. 7. Pump-light was output from the semiconductor laser 10 and each power of the pump-light output from the multi-core fiber 11a, and the two no-cladding GI fibers 11c was measured. A ratio of the measured power to the output power from the semiconductor laser 10 was calculated for each sample. The sample 1'-1 had the following results:

the ratio in relation to the no-cladding GI fiber 11c was 23.3%, the ratio in relation to the no-cladding GI fiber 11c was 24.6%, and the ratio in relation to the multi-core fiber 11a was 51.5%. The sample 1'-2 had the following results:

the ratio in relation to the no-cladding GI fiber 11c was 24.6%, the ratio in relation to the no-cladding GI fiber 11c was 23.7%, and the ratio in relation to the multi-core fiber 11a was 50.4°. In the above results, it was found that the no-cladding GI fiber 11c is effective for collection of pump-light.

Figure 8:
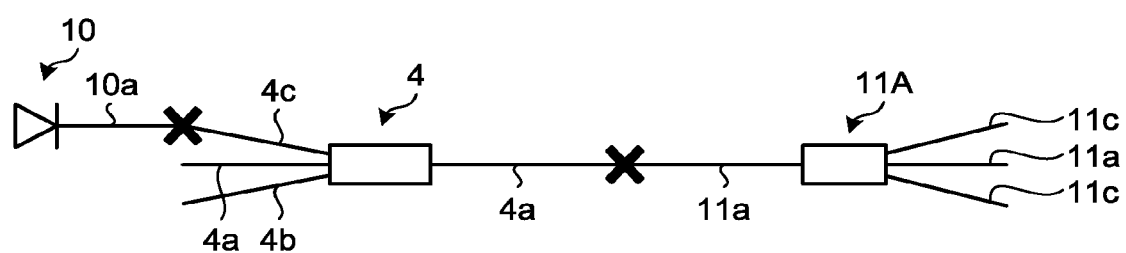
FIG. 8 is a diagram explaining experimental example 2.

FIG. 8 is a diagram explaining experimental example 2. In the experimental example 2, the multi-mode optical fiber 10a to which the semiconductor laser 10 had been attached was connected to the pump-light supply optical fiber 4c of the first optical coupler 4. An optical coupler 11A includes the multi-core fiber 11a and the two no-cladding GI fibers 11c in the same manner as the samples 1'-1 and 1'-2. The main optical fiber 4a of the first optical coupler 4 and the multi-core fiber 11a were fusion-spliced at the position indicated with the symbol "X". The main optical fiber 4a and the multi-core fiber 11a were connected such that pump-light output from the main optical fiber 4a is coupled to the inner cladding portion of the multi-core fiber 11a.

Samples 2-1 and 2-2 having the configuration illustrated in FIG. 8 were made. Pump-light was output from the semiconductor laser 10 and each power of the pump-light output from the multi-core fiber 11a, and the two no-cladding GI fibers 11c was measured. A ratio of the measured power to the output power from the semiconductor laser 10 was calculated for each sample. The sample 2-1 had the following results:

the ratio in relation to the no-cladding GI fiber 11c was 17.4%, the ratio in relation to the no-cladding GI fiber 11c was 16.9%, and the ratio in relation to the multi-core fiber 11a was 41.3%. The sample 2-2 had the following results:

the ratio in relation to the no-cladding GI fiber 11c was 15.9%, the ratio in relation to the no-cladding GI fiber 11c was 16.5%, and the ratio in relation to the multi-core fiber 11a was 46.8%. In the above results, it was found that the no-cladding GI fiber 11c is effective for collection of pump-light.

Figure 9A:
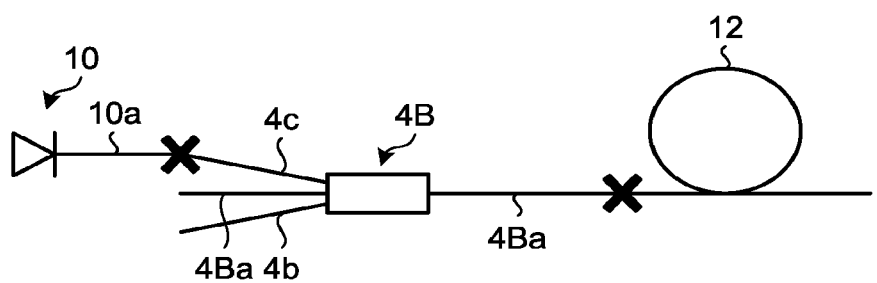
FIG. 9A is a diagram explaining experimental example 3.
Figure 9B:
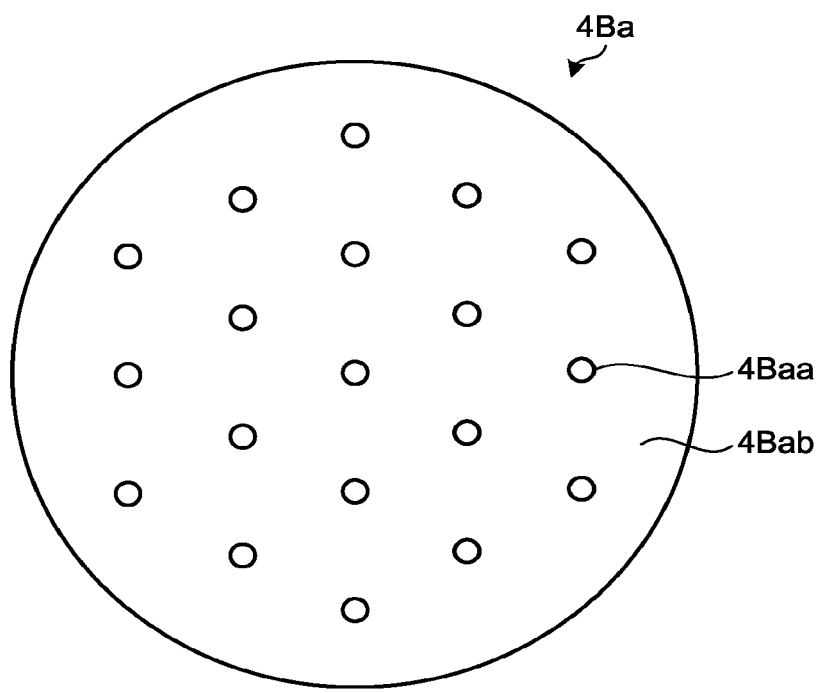
FIG. 9B is a diagram explaining the experimental example 3.

In the experimental examples 1 and 2, the no-cladding GI fibers 11c had different ratios. Experimental example 3 was done for finding the reason. FIG. 9 is a diagram explaining the experimental example 3. In the experimental example 3, as illustrated in FIG. 9A, the multi-mode optical fiber 10a to which the semiconductor laser 10 had been attached was connected to an optical coupler 4B instead of the first optical coupler 4. The optical coupler 4B includes a main optical fiber 4Ba instead of the main optical fiber 4a. As illustrated in FIG. 9B, the main optical fiber 4Ba includes 19 cores 4Baa arranged in a triangular lattice shape so as to form regular hexagon as a whole and an inner cladding portion 4Bab. The main optical fiber 4Ba is a 19-core multi-core fiber. One end of the main optical fiber 4Ba was connected to a multi-core EDF 12. The multi-core EDF 12 also includes 19 optical amplifying cores arranged in a triangular lattice shape in the same manner as the main optical fiber 4Ba, an inner cladding portion, and an outer cladding portion. The multi-core EDF 12 is a 19-core double cladding EDF and the length thereof is 4 meters.

A near-field pattern was measured for each of outputs of the multi-mode optical fiber 10a, the main optical fiber 4Ba of the optical coupler 4B, and the multi-core EDF 12 when pump-light was output from the semiconductor laser 10.

Figure 10A:
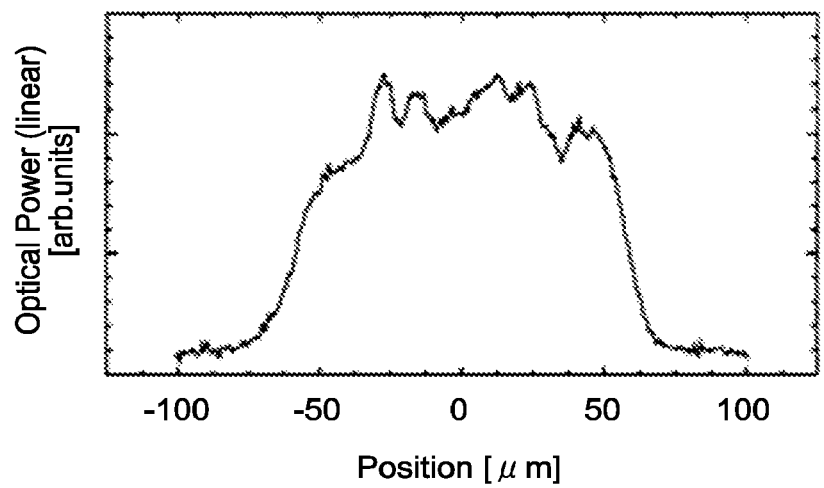
FIG. 10A is a diagram illustrating an optical power profile of a near-field pattern.
Figure 10B:
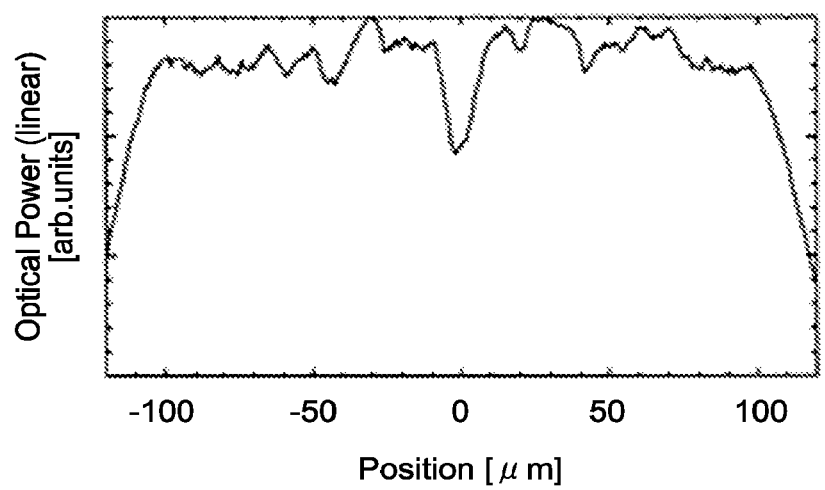
FIG. 10B is a diagram illustrating an optical power profile of a near-field pattern.
Figure 10C:
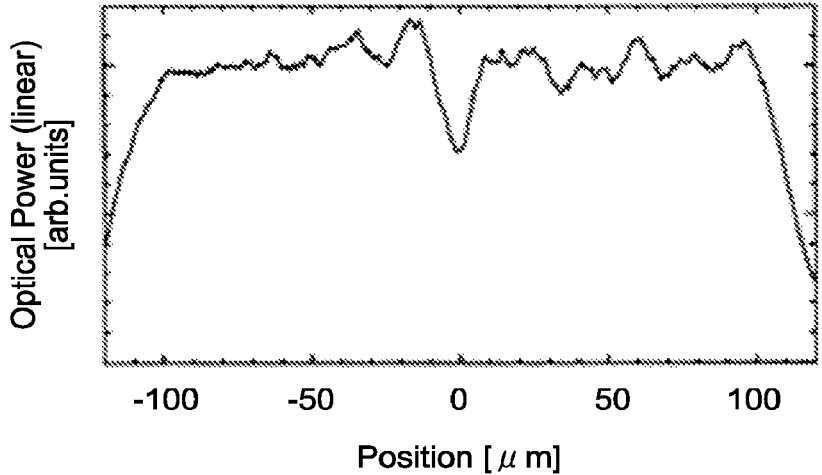
FIG. 10C is a diagram illustrating an optical power profile of a near-field pattern.

FIG. 10 is a diagram illustrating optical power profiles in near-field patterns. FIGS. 10A, 10B, and 10C each illustrate the power profile on a cross section passing through the center axis of the near-field pattern of the outputs of the multi-mode optical fiber 10a, the main optical fiber 4Ba of the optical coupler 4B, and the multi-core EDF 12, respectively. The abscissa axis represents the position with respect to the center axis while the vertical axis represents the optical power (linear scale with an arbitrary unit). The power profile in FIG. 10A has a mountain shape. The power profiles in FIGS. 10B and 10C each have a flat-top shape. From FIGS. 10A, 10B, and 10C, the shape of optical power profile of pump-light differs before and after the optical coupler 4B. The same phenomenon also occurs before and after the first optical coupler 4. It is thus considered that the ratio differs in the experimental examples 1 and 2.

Figure 11:
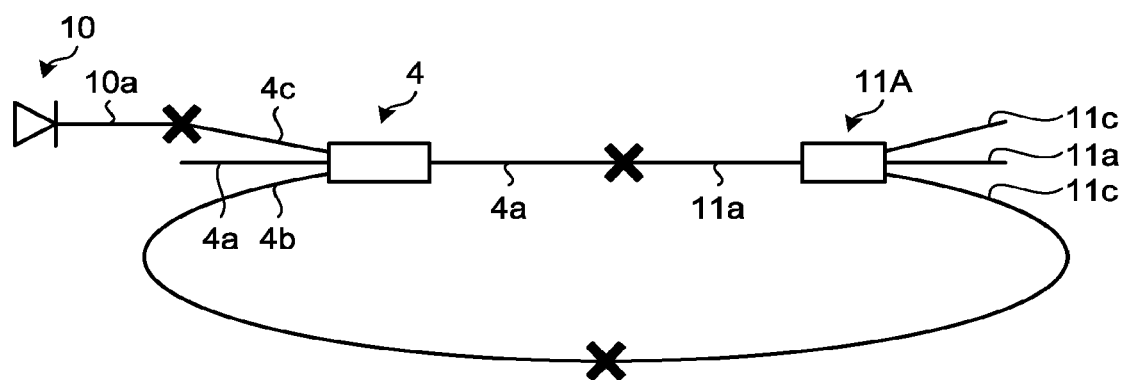
FIG. 11 is a diagram explaining experimental example 4.

FIG. 11 is a diagram explaining experimental example 4. In the experimental example 4, the pump-light input-output optical fiber 4b (in this example, no-cladding GI fiber) of the first optical coupler 4 and the no-cladding GI fiber 11c of the optical coupler 11 in the configuration illustrated in FIG. 8 were fusion-spliced. Samples 4-1 and 4-2 thus configured were made. Pump-light was output from the semiconductor laser 10. Power output from the multi-core fiber 11a was measured for each sample. The ratio of the measured power to the pump-light power at the connection point (position indicated with the symbol "X") of the main optical fiber 4a and the multi-core fiber 11a was calculated. The ratio was 120.1% in the sample 4-1 while the ratio was 118.5% in the sample 4-2. As for the results, it is considered that part of pump-light is collected by the no-cladding GI fiber 11c of the optical coupler 11A and the collected pump-light is input in the pump-light input-output optical fiber 4b and input again to the main optical fiber 4a by the first optical coupler 4, i.e., the pump-light is recycled, resulting in the ratio being increased by as much as 18% to 20%.

Figure 12:
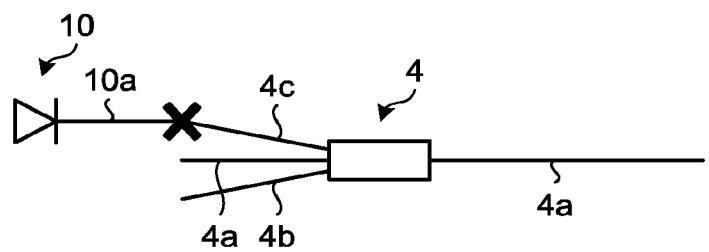
FIG. 12 is a diagram explaining experimental example 5.

In experimental example 5, samples 5-1 and 5-2 were made that have the configuration illustrated in FIG. 12 by cutting between the main optical fiber 4a and the multi-core fiber 11a in the samples 2-1 and 2-2 having the configuration illustrated in FIG. 8. Pump-light was output from the semiconductor laser 10. Power of the pump-light output from the main optical fiber 4a was measured for each sample. The ratio of the measured power to the pump-light power at the connection point of the multi-mode optical fiber 10a and the main optical fiber 4a was calculated for each sample. The ratio was 84.5% in the sample 5-1 while the ratio was 81.0% in the sample 5-2.

Samples 6-1 and 6-2 were made by changing the multi-mode optical fiber 10a from the pump-light input-output optical fiber 4b to the pump-light input-output optical fiber 4b (in the samples, the no-cladding GI fiber). The measurement and ratio calculation were done in the same manner as the samples 5-1 and 5-2. The ratio was 90.5% in the sample 6-1 while the ratio was 88.8% in the sample 6-2. In the comparison of the results of the samples 5-1, 5-2, 6-1, and 6-2, it was found that the pump-light input-output optical fiber 4b is more capable of increasing coupling efficiency to the main optical fiber 4a of the first optical coupler 4 than that of the multi-mode optical fiber 10a.

Samples 7-1 and 7-2 were made by replacing the first optical coupler 4 with an optical coupler having a configuration in which the pump-light supply optical fiber 4c is replaced with the pump-light input-output optical fiber 4b (in the samples, no-cladding GI fiber), and the additional semiconductor laser 10 is connected to the pump-light input-output optical fiber 4b via the additional multi-mode optical fiber 10a, in the samples 6-1 and 6-2. The measurement and ratio calculation were done for the two pump-light input-output optical fibers 4b in each of the samples 7-1 and 7-2 in the same manner as the samples 5-1 and 5-2. The ratio was 87.0% and 87.2% in the sample 7-1 while the ratio was 88.8% and 88.7% in the sample 7-2.

Examples 1 and 2 and Comparative Examples 1 and 2

As example 1, an optical amplifier was made that has the same configuration as the optical amplifier 100 according to the first embodiment illustrated in FIG. 1. The no-cladding GI fiber having the characteristic illustrated in FIG. 5 was used for the pump-light input-output optical fiber of the first optical coupler and the pump-light input-output optical fiber of the second optical coupler. The length of the multi-core EDF was 8 m so as to preferably allow the optical amplification of signal light having a wavelength band of a C band (approximately 1.53 to 1.565 μm). Signal light, which is CW light having a wavelength of 1550 nm and an optical power of −5 dBm, was input in the core near the center axis (center core) of the multi-core EDF via the optical isolator on the input side. The power (output power) of the signal light output from the optical isolator on the output side was measured while a driving current of 5 A flowed in the semiconductor laser. A gain and a noise figure (NF) of the optical amplifier were calculated. When a driving current of 5 A flowed in the semiconductor laser, the power of pump-light output from the semiconductor laser is approximately 10 W and the power consumption is 21.65 W.

In the example 1, the gain was 16.65 dB, the NF was 4.82 dB, and the output power was 11.63 dBm. As an optical amplifier of comparative example 1, an optical amplifier was made that has a configuration in which the two pump-light input-output optical fibers are not connected in the optical amplifier of the example 1 so as not to recycling pump-light. The measurement was done under the same condition as the optical amplifier in the example 1. The gain was 15.98 dB, the NF was 4.83 dB, and the output power was 10.96 dBm.

The optical amplifier of the example 1 has the gain and the output power larger than those of the optical amplifier of the comparative example 1 by 0.67 dB, respectively. This is because of the effect of recycling of pump-light. When the driving current was reduced in the optical amplifier of the example 1 so as to achieve the same output power as the optical amplifier of the comparative example 1, the same output power as the optical amplifier in the comparative example 1 was achieved by the optical amplifier of the example 1 when the driving current was 4.5 A. When a driving current of 4.5 A flows in the semiconductor laser, the power of pump-light output from the semiconductor laser is approximately 9 W and the power consumption is 19.32 W. It was, thus, checked that the optical amplifier of the example 1 can reduce the power of pump-light by 1 W than that of the comparative example 1 when the optical amplifier of the example 1 is operated so as to output the same output power as the optical amplifier of the comparative example 1, and can reduce the power consumption of the semiconductor laser by 2.33 W (i.e., approximately 11%).

As example 2, an optical amplifier was made by replacing the multi-core EDF of the optical amplifier in the example 1 with the multi-core EDF having a length of 50 m so as to preferably allow the optical amplification of signal light having a wavelength band of an L band (approximately 1.57 to 1.61 μm). Signal light, which is CW light having a wavelength of 1590 nm and an optical power of 5 dBm, was input in the center core of the multi-core EDF via the optical isolator on the input side. The output power of the signal light output from the optical isolator on the output side was measured while a driving current of 5 A flowed in the semiconductor laser. The gain and the NF were calculated.

In the example 2, the gain was 13.71 dB, the NF was 5.33 dB, and the output power was 18.72 dBm. As an optical amplifier of comparative example 2, an optical amplifier was made that has a configuration in which the two pump-light input-output optical fibers are not connected in the optical amplifier of the example 2 so as not to recycling pump-light. The measurement was done under the same condition as the optical amplifier in example 2. The gain was 13.47 dB, the NF was 5.46 dB, and the output power was 18.48 dBm.

The optical amplifier of example 2 has the gain and the output power larger than those of the optical amplifier of the comparative example 2 by 0.24 dB, respectively. This is because of the effect of recycling of pump-light. When the driving current was reduced in the optical amplifier of the example 2 so as to achieve the same output power as the optical amplifier of the comparative example 2, the same output power as the optical amplifier in the comparative example 2 was achieved by the optical amplifier of the example 2 when the driving current was 4.86 A. When a driving current of 4.86 A flows in the semiconductor laser, the power of pump-light output from the semiconductor laser is approximately 9.72 W and the power consumption is 21 W. It was, thus, found that the optical amplifier of the example 2 can reduce the power of pump-light by 0.28 W than that of the comparative example 2 when the optical amplifier of the example 2 is operated so as to output the same output power as the optical amplifier of the comparative example 2, and can reduce the power consumption of the semiconductor laser by 0.65 W (i.e., approximately 3%).

Second Embodiment

Figure 13:
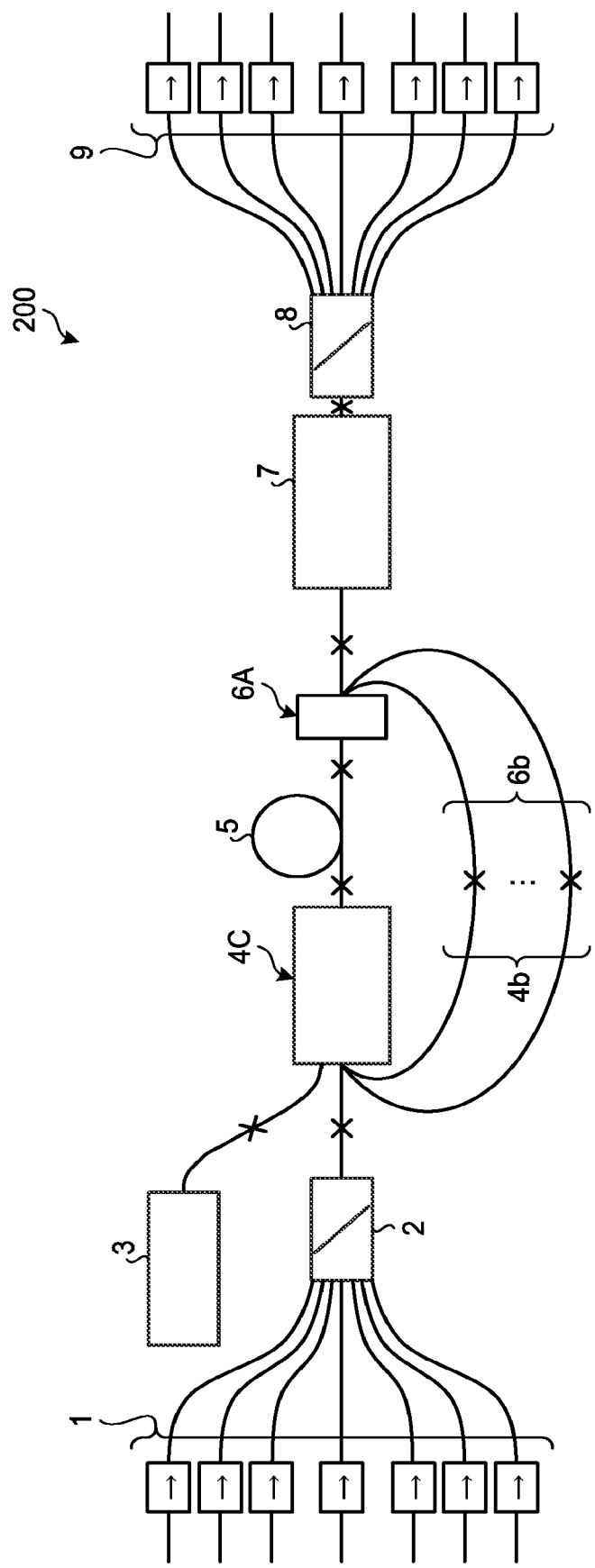
FIG. 13 is a schematic diagram illustrating a configuration of an optical amplifier according to a second embodiment.

FIG. 13 is a schematic diagram illustrating a configuration of an optical amplifier according to a second embodiment. As illustrated in FIG. 13, an optical amplifier 200 has a configuration in which the first optical coupler 4 and the second optical coupler 6 of the optical amplifier 100 according to the first embodiment illustrated in FIG. 1 are replaced with a first optical coupler 4C and a second optical coupler 6A, respectively.

The first optical coupler 4C, which has a configuration in which one or more pump-light input-output optical fiber 4b is added to the first optical coupler 4, includes a plurality of pump-light input-output optical fibers 4b. Each pump-light input-output optical fiber 4b is fusion-spliced to the inner cladding portion at a portion from which the outer cladding portion of the main optical fiber of the first optical coupler 4C is removed, and the average refractive index of the pump-light input-output optical fiber 4b in the contact region where the pump-light input-output optical fiber 4b is in contact with the inner cladding portion is larger than the refractive index of the inner cladding portion.

The second optical coupler 6A, which has a configuration in which one or more pump-light input-output optical fiber 6b is added to the second optical coupler 6, includes the same number of pump-light input-output optical fibers 6b as the number of pump-light input-output optical fibers 4b. Each pump-light input-output optical fiber 6b is fusion-spliced to the inner cladding portion at a portion from which the outer cladding portion of the main optical fiber of the second optical coupler 6A is removed, and the average refractive index of the pump-light input-output optical fiber 6b in the contact region where the pump-light input-output optical fiber 6b is in contact with the inner cladding portion is larger than the refractive index of the inner cladding portion.

Each pump-light input-output optical fiber 6b is connected to one of the pump-light input-output optical fibers 4b. This configuration makes it possible to collect and recycling pump-light by a plurality of optical fiber paths. As a result, the pump-efficiency is further increased.

Third Embodiment

Figure 14:
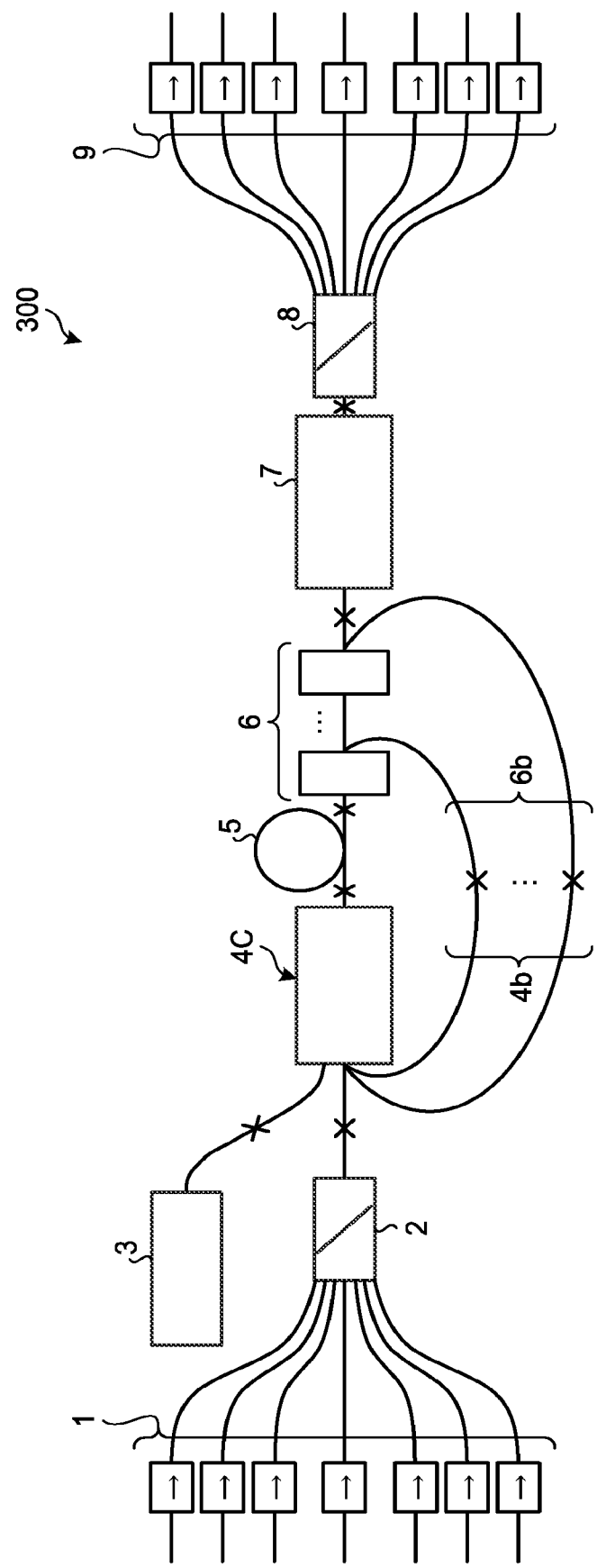
FIG. 14 is a schematic diagram illustrating a configuration of an optical amplifier according to a third embodiment.

FIG. 14 is a schematic diagram illustrating a configuration of an optical amplifier according to a third embodiment. As illustrated in FIG. 14, an optical amplifier 300 has a configuration in which the second optical coupler 6A of the optical amplifier 200 according to the second embodiment illustrated in FIG. 13 is replaced with a plurality of second optical couplers 6.

The same number of second optical couplers 6 as the number of pump-light input-output optical fibers 4b of the first optical coupler 4C are included. The corresponding main optical fibers are connected each other in series. Each pump-light input-output optical fiber 6b included in the second optical couplers 6 is connected to one of the pump-light input-output optical fibers 4b of the first optical coupler 4C. This configuration makes it possible to collect and recycling pump-light by a plurality of optical fiber paths. As a result, the pump-efficiency is further increased.

Fourth Embodiment

Figure 15:
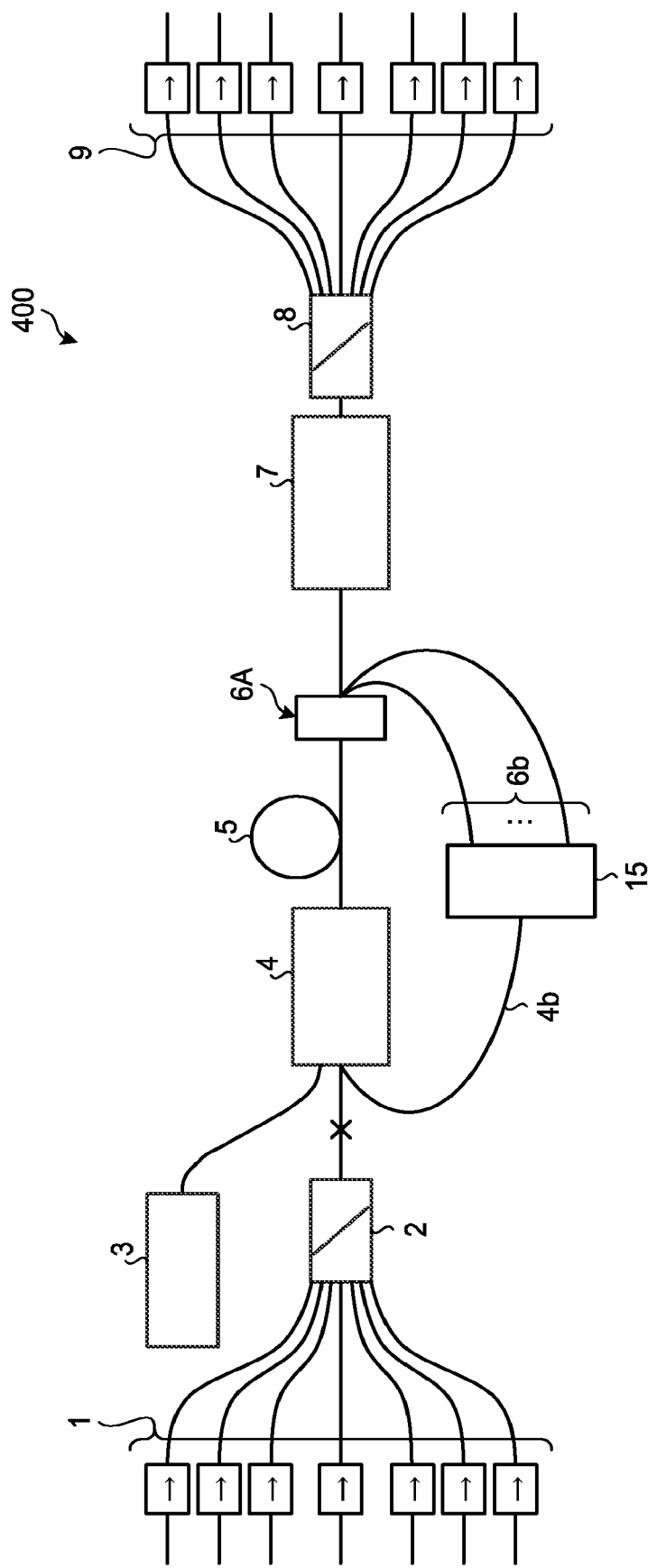
FIG. 15 is a schematic diagram illustrating a configuration of an optical amplifier according to a fourth embodiment.

FIG. 15 is a schematic diagram illustrating a configuration of an optical amplifier according to a fourth embodiment. As illustrated in FIG. 15, an optical amplifier 400 has a configuration in which the first optical coupler 4C of the optical amplifier 200 according to the second embodiment illustrated in FIG. 13 is replaced with the first optical coupler 4 and a pump-light multiplexer 15 is added.

The pump-light input-output optical fiber 4b included in the first optical coupler 4 and the multiple pump-light input-output optical fibers 6b included in the second optical coupler 6A are connected via the pump-light multiplexer 15. The pump-light multiplexer 15 multiplexes pump-light components that propagates in each of the pump-light input-output optical fibers 6b after the collection of pump-light by the second optical coupler 6A, and outputs the multiplexed pump-light to the pump-light input-output optical fiber 4b. The multiplexed pump-light propagates in the pump-light input-output optical fiber 4b and enters the first optical coupler 4, in which the multiplexed light is recycled. This configuration can reduce the number of pump-light input-output optical fibers 4b that need to be included in the first optical coupler 4, thereby making it possible to simplify the configuration of the first optical coupler 4. The pump-light multiplexer 15 may be a lateral coupling type optical multiplexer, which is the same kind as the first optical coupler 4, for example, or an edge coupling type optical multiplexer employed by a tapered fiber bundle (TFB), for example.

Figure 16:
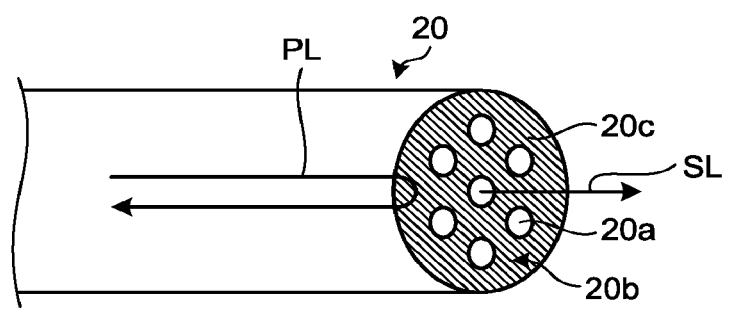
FIG. 16 is a diagram explaining example 1 of a recycling mechanism of pump-light using reflection of light.

A mechanism illustrated in FIG. 16 is exemplified as example 1 of a recycling mechanism of pump-light other than those in the embodiments. In the mechanism, a reflection film 20c including a metal deposition film or a dielectric multilayer film is formed at both edges of a multi-core EDF 20 such that the reflection film 20c covers an inner cladding portion 20b other than optical amplifying cores 20a on the edge. In the mechanism, signal light SL is output from the optical amplifying core 20a while pump-light PL is reflected by the reflection film 20c to be returned to the multi-core EDF 20, in which the pump-light PL is recycled.

Another mechanism illustrated in FIG. 17 is exemplified as example 2. In the mechanism, between a multi-core EDF 30 and a multi-core fiber 31, a lens 32, a wavelength division multiplexing (WDM) filter 33, and a lens 34 are provided and a lens 35 and a reflection mirror 36 are further provided. In the mechanism, the signal light SL output from an optical amplifying core 30a of the multi-core EDF 30 is converted by the lens 32 to collimated light, travels through the WDM filter 33, and is converged by the lens 34 to a core 31a of the multi-core fiber 31 to be coupled. The pump-light PL output from an inner cladding portion 30b of the multi-core EDF 30 is successively reflected by the WDM filter 33, the reflection mirror 36, and the WDM filter 33 to be returned to the multi-core EDF 30, in which the pump-light PL is recycled.

A configuration may be employed that reflects pump-light by fiber Bragg grating (FBG) other than the mechanism that reflects pump-light by a reflection film or a reflection mirror such as that illustrated in FIG. 16 or 17. For example, in the configuration of the optical amplifier 100 illustrated in FIG. 1, a first FBG may be written in a termination portion (rear stage side) of the multi-core EDF 5 or the multi-core fiber connected to the multi-core EDF 5 while a second FBG may be written in the optical fiber on the front stage side of the first optical coupler 4 (the optical fiber between the optical fiber fan in 2 and the first optical coupler 4). The first FBG and the second FBG, each of which has reflection characteristics that selectively reflect pump-light (having a wavelength of 976 nm or 975 nm), each form a resonator selectively reflecting pump-light propagating in the inner cladding portion without influencing on signal light in a 1.5 µm band. This configuration allows remaining pump-light to travel between the first FBG and the second FBG, thereby making it possible to effectively use power of pump-light. As a result, the cladding pump-efficiency can be increased. Because the inner cladding portion allows multi-mode light, part of pump-light passes through the inner cladding portion regardless of that the FBGs are provided. It is, thus, preferable that the pump strippers removing passing through pump-light from the inner cladding portion be provided between the rear stage of the first FBG and the front stage of the second FBG. The pump strippers can prevent the optical fiber fan in 2 and the optical fiber fan out 8 from being damaged by heat. It is preferable that an isolator be inserted between the rear stage (light output side) of the semiconductor laser 3 and the front side of the first optical coupler 4 so as to prevent part of pump-light that is reflected by the FBG and propagates on the front stage side from returning to the semiconductor laser 3 via the first optical coupler 4.

In the embodiments described above, the optical amplifying fiber is a seven-core multi-core EDF. The optical amplifying fiber may be 19-core multi-core EDF or a single-core EDF. In the embodiments described above, the optical amplifying medium in the optical amplifying fiber is erbium. Another optical amplifying medium such as ytterbium may be used. In the embodiments described above, a single semiconductor laser serving as the pump-light source is used and the first optical coupler includes a single pump-light supply optical fiber. A plurality of pump-light sources may be used and the first optical coupler may include a plurality of pump-light supply optical fibers. In the embodiments described above, the no-cladding GI fiber is exemplified as the pump-light input-output optical fiber. A regular GI fiber having cladding and a step-index type optical fiber may be used as long as they satisfy the conditions of the pump-light input-output optical fiber. The refractive index profile may be constant or vary in the radius direction. In the embodiments described above, the optical amplifier is a forward pumping type. The optical amplifier may be a backward pumping type or a bidirectional pumping type. The backward pumping type optical amplifier is exemplarily configured as follows: the first optical coupler 4 is connected on the optical fiber fan out 8 side while the pump stripper 7 is connected on the optical fiber fan in 2 side in the optical amplifier 100 of the first embodiment.

The present disclosure is not limited by the above embodiments. It is also included in the present disclosure that the constituent elements of the above embodiments are appropriately combined. Further effects and modifications can be easily derived by those skilled in the art. The broader aspects of the present disclosure are not limited to the above embodiments and various modifications are possible.

INDUSTRIAL APPLICABILITY

The optical coupler and the optical amplifier according to the present disclosure are suitable for the optical amplifier used for submarine optical communication and the like.

The present disclosure has an advantageous effect of capable of increasing the pump-efficiency in the optical amplifier.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

The invention claimed is:

1. An optical coupler, comprising:
a main optical fiber that includes at least one core, which transmits signal light, an inner cladding portion, formed around an outer periphery of the core, having a refractive index lower than a refractive index of the core, and an outer cladding portion, formed around an outer periphery of the inner cladding portion, having a refractive index lower than the refractive index of the inner cladding portion, a part of the outer cladding portion of which in a longitudinal direction being removed; and
at least one pump-light input-output optical fiber that is fusion-spliced to the inner cladding portion of the main optical fiber at a portion where the outer cladding portion is removed, an average refractive index of which in a contact region where the pump-light input-output optical fiber is in contact with the inner cladding portion being larger than the refractive index of the inner cladding portion, wherein
pump-light propagating in the pump-light input-output optical fiber is coupled to the inner cladding portion from the contact region and propagates in the inner cladding portion, or the pump-light propagating in the inner cladding portion is coupled to the pump-light input-output optical fiber from the contact region and propagates in the pump-light input-output optical fiber.

2. The optical coupler according to claim 1, wherein a relative refractive-index difference of the average refractive index of the pump-light input-output optical fiber in the contact region with respect to the refractive index of the inner cladding portion is equal to or larger than 0.05%.

3. The optical coupler according to claim 1, comprising a plurality of the pump-light input-output optical fibers.

4. The optical coupler according to claim 3, comprising a pump-light multiplexer that multiplexes the pump-light propagating in each of the pump-light input-output optical fibers.

5. The optical coupler according to claim 1, further comprising a pump-light supply optical fiber, having one end which is connected to a pump-light source outputting the pump-light, and another end which is fusion-spliced to the inner cladding portion of the main optical fiber at the portion where the outer cladding portion is removed, and supplying the pump-light to the main optical fiber.

6. The optical coupler according to claim 5, wherein the average refractive index of the pump-light supply optical fiber in a contact region where the pump-light supply optical fiber is in contact with the inner cladding portion is larger than the refractive index of the inner cladding portion.

7. An optical amplifier, comprising:
a pump-light source;
a cladding pumping optical amplifying fiber that includes an optical amplifying core including an optical amplifying medium;
a first optical coupler that is the optical coupler according to claim 1, and in which the pump-light source is connected to the pump-light supply optical fiber and one end of the optical amplifying fiber is connected to one end of the main optical fiber; and
a second optical coupler that is the optical coupler according to claim 1, and in which another end of the optical amplifying fiber is connected to one end of the main optical fiber,
wherein the pump-light input-output optical fiber of the first optical coupler and the pump-light input-output optical fiber of the second optical coupler are connected to each other.

8. The optical amplifier according to claim 7, wherein the optical amplifying fiber includes a plurality of the optical amplifying cores.

9. The optical amplifier according to claim 7, wherein the optical amplifying cores include erbium as the optical amplifying medium.

10. The optical amplifier according to claim 7, wherein a difference between a refractive index profile of the pump-light input-output optical fiber of the first optical coupler and a refractive index profile of the pump-light input-output optical fiber of the second optical coupler is in a range of ±0.2% in a relative refractive-index difference.

11. The optical amplifier according to claim 7, wherein numerical aperture of the pump-light input-output optical fiber of the second optical coupler is equal to or smaller than numerical aperture of the pump-light input-output optical fiber of the first optical coupler.

* * * * *